United States Patent
Bozso et al.

[11] Patent Number: 6,067,245
[45] Date of Patent: May 23, 2000

[54] HIGH SPEED, HIGH BANDWIDTH, HIGH DENSITY NONVOLATILE MEMORY SYSTEM

[75] Inventors: Ferenc Miklos Bozso, Ridgefield; Philip George Emma, Danbury, both of Conn.

[73] Assignee: International Business Machines Corporation, Armonk, N.Y.

[21] Appl. No.: 09/442,355

[22] Filed: Nov. 17, 1999

Related U.S. Application Data

[62] Division of application No. 09/024,759, Feb. 17, 1998.

[51] Int. Cl.[7] .................................................. G11C 12/22
[52] U.S. Cl. ........................................ 365/145; 365/149
[58] Field of Search ...................................... 365/145, 149

[56] References Cited

U.S. PATENT DOCUMENTS

| | | |
|---|---|---|
| 4,873,664 | 10/1989 | Eaton, Jr. . |
| 5,024,964 | 6/1991 | Rohrer et al. . |
| 5,036,490 | 7/1991 | Kajimura et al. . |
| 5,132,934 | 7/1992 | Quate et al. . |
| 5,289,408 | 2/1994 | Mimura et al. . |
| 5,291,436 | 3/1994 | Kamisawa ................................ 365/145 |
| 5,317,533 | 5/1994 | Quate et al. . |
| 5,530,667 | 6/1996 | Omura et al. . |
| 5,530,668 | 6/1996 | Chern et al. . |
| 5,835,400 | 3/1994 | Jeon et al. ................................ 365/145 |

FOREIGN PATENT DOCUMENTS

| | | |
|---|---|---|
| 2140973 | 5/1990 | Japan . |
| 4208565 | 7/1992 | Japan . |
| 8147982 | 6/1996 | Japan . |
| 9128960 | 5/1997 | Japan . |

OTHER PUBLICATIONS

J.F. Scott, "Ferroelectric memories", Physics World, Feb. 1995, pp. 46–50.

"Solid State Devices Add a Third Dimension to Increase Density" R&D Magazine, Jun. 1995, pp. 37–40.

*Primary Examiner*—Huan Hoang
*Attorney, Agent, or Firm*—Wayne L. Ellenbogen; F. Chau & Associates, LLP

[57] ABSTRACT

A nonvolatile memory system is described. The system includes ferroelectric memory cells each comprising a pair of metal plates and a ferroelectric material therebetween. Data are stored in the cells by applying an electric field corresponding to the desired data value across a given cell, thereby setting the polarity of the ferroelectric material to a given state. A datum is read from a cell by a mechanical force to the ferroelectric material and sensing charge induced on one of the cells.

12 Claims, 15 Drawing Sheets

HIGH SPEED, HIGH BANDWIDTH, HIGH DENSITY NONVOLATILE MEMORY SYSTEM

CROSS-REFERENCE TO RELATED APPLICATION

This application is a Divisional of U.S. application Ser. No. 09/024,759 filed on Feb. 17, 1998.

FIELD OF THE INVENTION

This invention generally relates to memory systems, and specifically uses ferroelectric films to create memory systems that are nonvolatile. The invention demonstrates impressive volumetric density, random access capability, and bandwidth and access times that far exceed what is possible with current rotating magnetic media.

BACKGROUND OF THE INVENTION

Ferroelectric materials, such as $BaTiO_3$ and $SrTiO_3$ are known to possess a low symmetry that allows them to be polarized by an electric field, as shown in FIG. 1a. As used herein, the term "ferroelectric material" refers to any material in which polarity can be permanently set by means of application of an electric field, and encompasses the specific materials enumerated above and any other materials having the described properties.

The polarization of ferroelectrics increases as the voltage across the film is increased. When the electric field passes a saturation-polarization threshold, the film remains permanently polarized in that direction, and will decay to a fixed remnant polarization some time after the voltage is removed. This phenomenon is shown in FIG. 1b.

Threshold voltage depends on the thickness of the film. For a typical 0.2 micron thin film, 3–5 Volts is quite ample to effect a change in polarization in either direction for most ferroelectric films.

FIG. 2 shows that there is a relationship between physical pressure on a polarized film 22 (where the direction of polarization is indicated by arrows 20), and induced voltage. When a polarized film is compressed, for example by a distance $\Delta Z$ as shown in FIG. 2, a small displacement current through the film is generated in the compressed film. This results in charge accumulating at the surfaces of the film (e.g., on metal plates) which is the manifestation of the voltage induced by the applied pressure. Whether the voltage is positive or negative depends on the polarity of the film.

This mechanism also works in reverse. Particularly, if a voltage is applied across a polarized film, the film expands or contracts depending on the magnitude of the voltage, and whether the voltage is positive or negative with respect to polarization. This effect is characterized by the ferroelectric's piezoelectric coefficient, which is in the range of 200 pC/N for the typical kinds of ferroelectric films in use today.

SUMMARY OF THE INVENTION

It is an object of the invention to provide a memory cell in which the state of the cell can be determined by applying a mechanical force to the cell and reading an induced electrical charge therefrom.

It is another object of the present invention to provide a nonvolatile memory system using ferroelectric films having a first film used to store a polarization state, and a second film used to apply mechanical pressure to the first film for the purposes of sensing the stored polarization state.

It is another object of the invention to integrate the aforementioned films onto a silicon surface so that circuitry in the silicon can be used to store polarization states, and to sense polarization states.

It is another object of the invention to use the aforementioned circuitry to provide random access to the stored states in the aforementioned ferroelectric film.

It is another object of the invention to use the aforementioned integrated silicon structure, henceforth referred to as a chip, to provide a wide parallel output which effects a high output bandwidth.

It is another object of the invention to provide periodic outputs from this chip by vibrating the aforementioned second film at its natural resonant frequency so as to operate the chip efficiently.

It is another object of the invention to create a memory system using two chips that share the aforementioned resonating structure by stacking the chips face to face, one on top of the other.

It is another object of the invention to create a larger memory system using a plurality of aforementioned memory systems by stacking the aforementioned memory systems on top of each other to obtain a large volumetric density, and even wider bandwidth.

It is another object of this invention to create an even larger memory system from a plurality of aforementioned larger memory systems in parallel.

BRIEF DESCRIPTION OF THE DRAWING

The foregoing and other objects, aspects, and advantages will be better understood from the following detailed description of a preferred embodiment of the invention with reference to the drawings, in which:

FIG. 4 further shows that the cells and the film are integrated onto a silicon surface, and the plurality of cells share circuitry that can be used to store or sense a polarization state, where each cell is coupled to this common circuitry through a passgate, and therefore, each cell is individually selectable for storing or sensing by this common circuitry;

DETAILED DESCRIPTION OF A PREFERRED EMBODIMENT OF THE INVENTION

Figure 3:
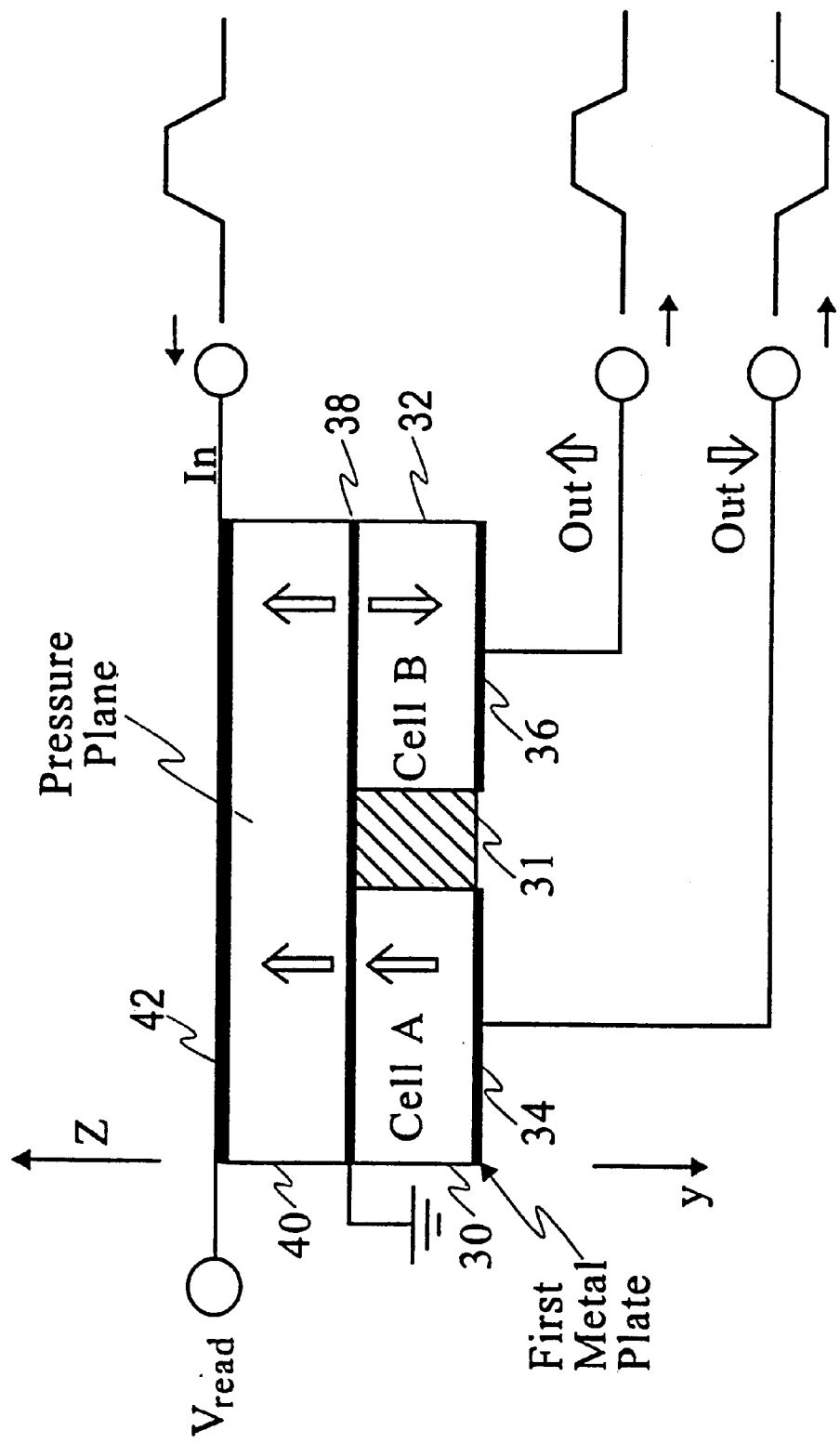
FIG. 3 shows a system comprising two adjacent cells made from a ferroelectric film, where the cells have opposite polarizations, and another ferroelectric film that is used to provide mechanical pressure to the pair in the manner depicted in FIG. 2, and it shows that the polarities of the voltages induced by the pressure mechanism correspond to the polarization polarities of each cell.

The invention will now be described in detail with respect to FIG. 3. The basic piezoelectric mechanism described above and its corresponding inverse mechanism can be used in tandem to sense, i.e., read, the polarization state of a ferroelectric film. FIG. 3 shows two cells, A and B, comprising respective ferroelectric films 30 and 32, and first metal plates 34 and 36 on the bottom surface of each cell.

Because, in the present embodiment, the ferroelectric films 30 and 32 are each part of a single contiguous layer, the area of each cell is defined by its respective first metal plate, since for instance, the area of the first film that is polarized is the local area directly over the first metal plate. Region 31 separates cells A and B, although in this embodiment, it is made from the same ferroelectric film and therefore forms part of a single layer with 30 and 32. It is crosshatched to indicate that it is not used in the same manner as the like material of films 30 and 32. For each cell, the first metal plate serves as the electrical output contact when the cell is sensed, and the electrical input contact when a new cell polarization state is written. The waveforms at the IN and OUT terminals of FIG. 3 illustrate the sensing process.

Both of the cells A and B in FIG. 3 have a surface attached to a second metal plate 38, which in the present embodiment is a single contiguous metal ground plane. A second polarized ferroelectric film 40 is disposed on the opposite surface of the metal plate 38, with film 40 having its other surface connected to a third metal plate 42.

Film 40 is sandwiched between the plates 38 and 42. This sandwich structure is mechanically constrained so that it can expand in the y direction, but not in the z direction, and the second ferroelectric film will therefore produce pressure when a voltage is applied to plate 42. This mechanical constraint is provided by placing the structure of FIG. 3 in a fixed-height package.

This resulting mechanical force will act on the pair of cells, inducing voltage thereacross which can be sensed at plates 34 and 36. The polarities of the induced voltage correspond to the local polarizations in films 30 and 32 directly above plates 34 and 36.

Figure 1B:
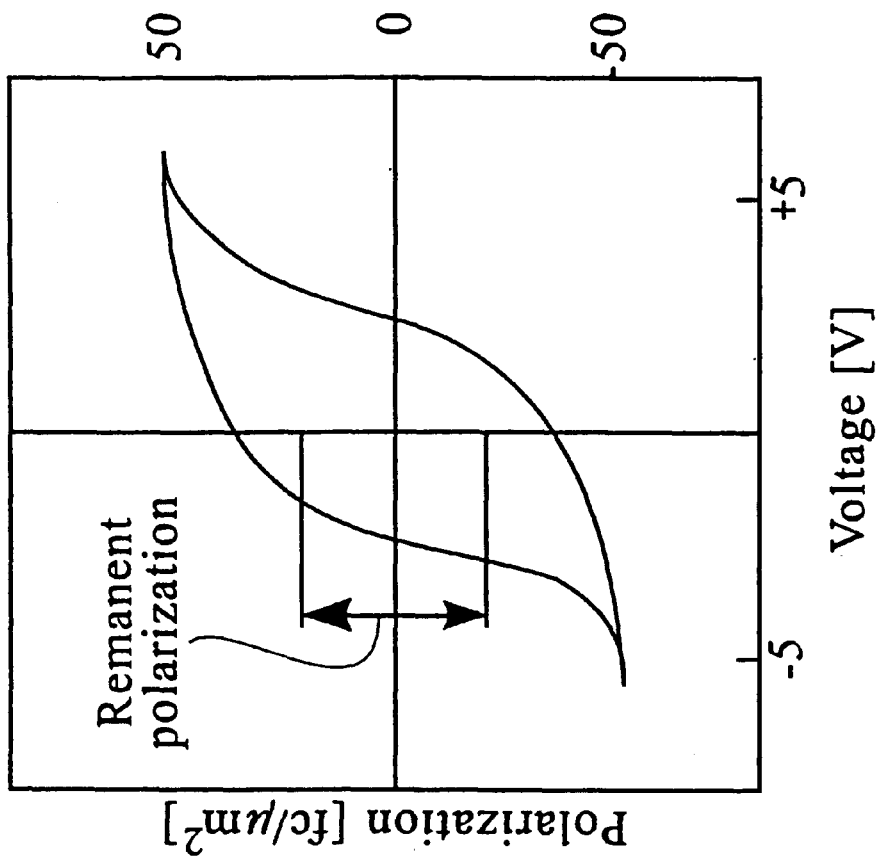
FIG. 1b shows a graph of the associated polarization hysteresis for the circuit of FIG. 1a as a function of an electric field applied across the film.
Figure 1A:
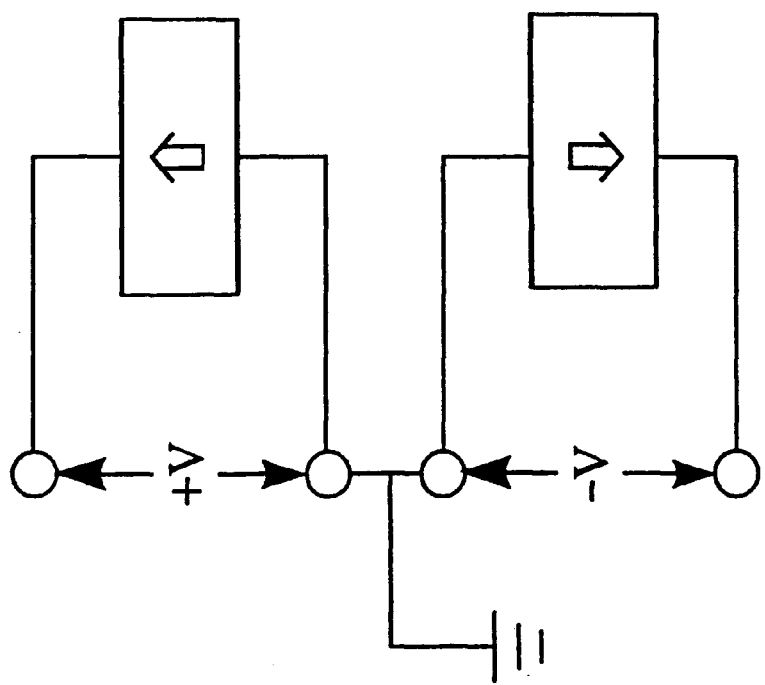
FIG. 1a shows two depictions of a ferroelectric film, each showing a different polarization.
Figure 2:
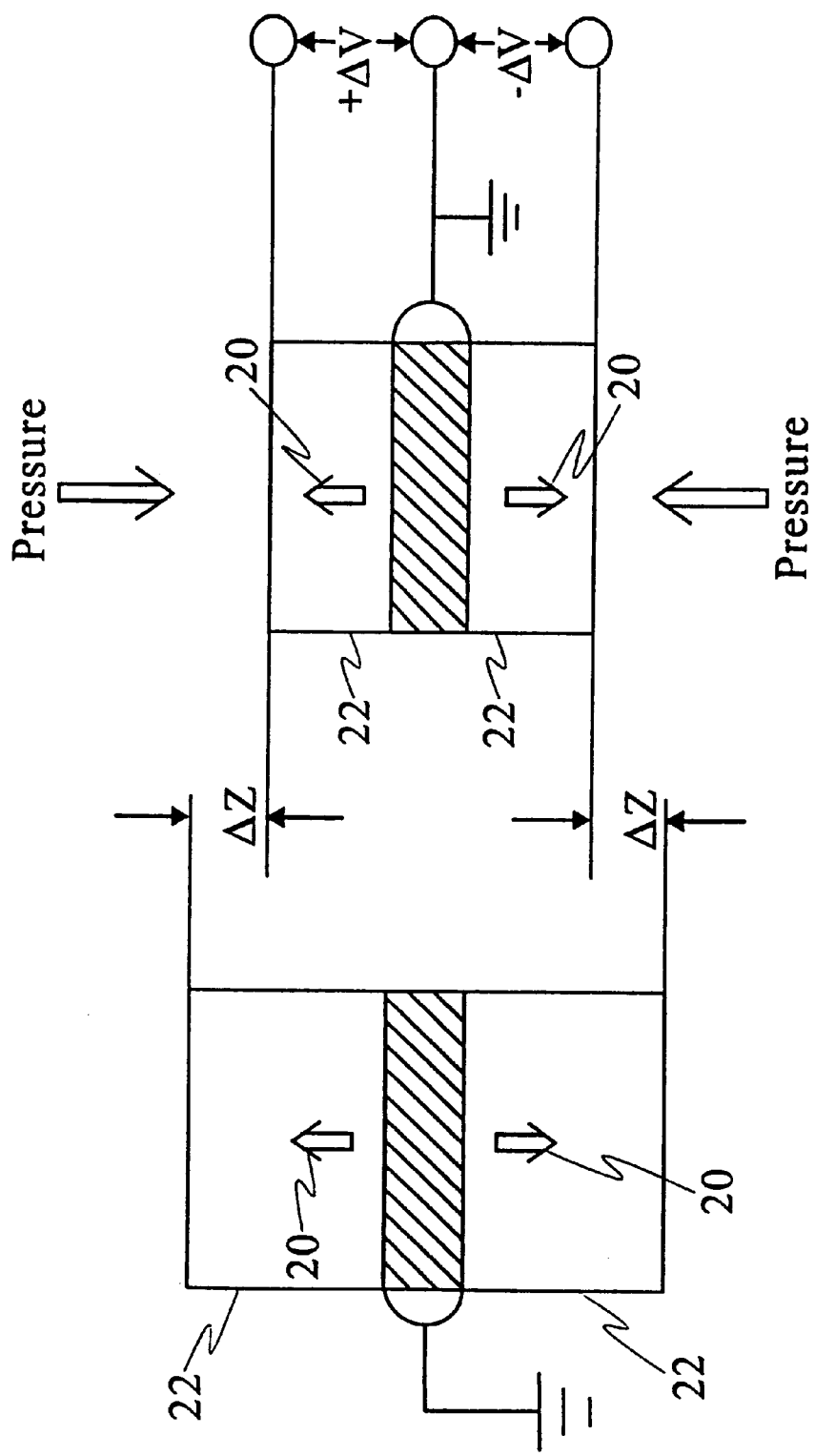
FIG. 2 shows two depictions of a ferroelectric film, each showing a different polarization, in which mechanical pressure on the film causes a voltage to be induced across the film, where the polarity of the resulting voltage corresponds to the polarization of the film.

Similarly, cells A and B can be written by applying positive or negative voltages to plates 34 and 36. The localized area in the film 30 and 32 over each plate will assume a polarization state corresponding to the polarity of the applied voltage, as was described with respect to FIG. 1.

As will be described, for reasonable values of all relevant parameters, the cells in FIG. 3 can be made very small (comparable to DRAM), very fast (comparable to SRAM), and can be made using simple processing techniques. Further, chips made of these cells can be made to provide high bandwidth when compared with known nonvolatile storage systems, and systems made of these chips can provide high capacity nonvolatile, storage that has the latency of a DRAM main-memory system.

To illustrate the usefulness of such a cell, assume that the output of plate 34 in FIG. 3 must drive a load of 25 fF (including wire and the receiving circuit), and that the receiving circuit must sense 100 mV. To put a 100 mV potential on 25 fF requires 0.1×6E18×25E−15=1.5E4 electrons. A piezoelectric coefficient of 200 pC/N corresponds to 200 electrons per square micron atmospheres. Therefore, generating 1.5E4 electrons requires 75 square micron atmospheres with the coefficient of 200 pC/N. At a conservative pressure of 15 atmospheres, a cell of 5 square microns is sufficient.

Very conservatively, a 5 square micron cell (perhaps conservatively made slightly larger) surrounded by a modest border, and incorporating a sense amplifier, can easily be fit into a 20 square micron area. This gives an aerial density of 5 Mbits per square centimeter, which is roughly 4 MBytes per square inch.

Figure 4:
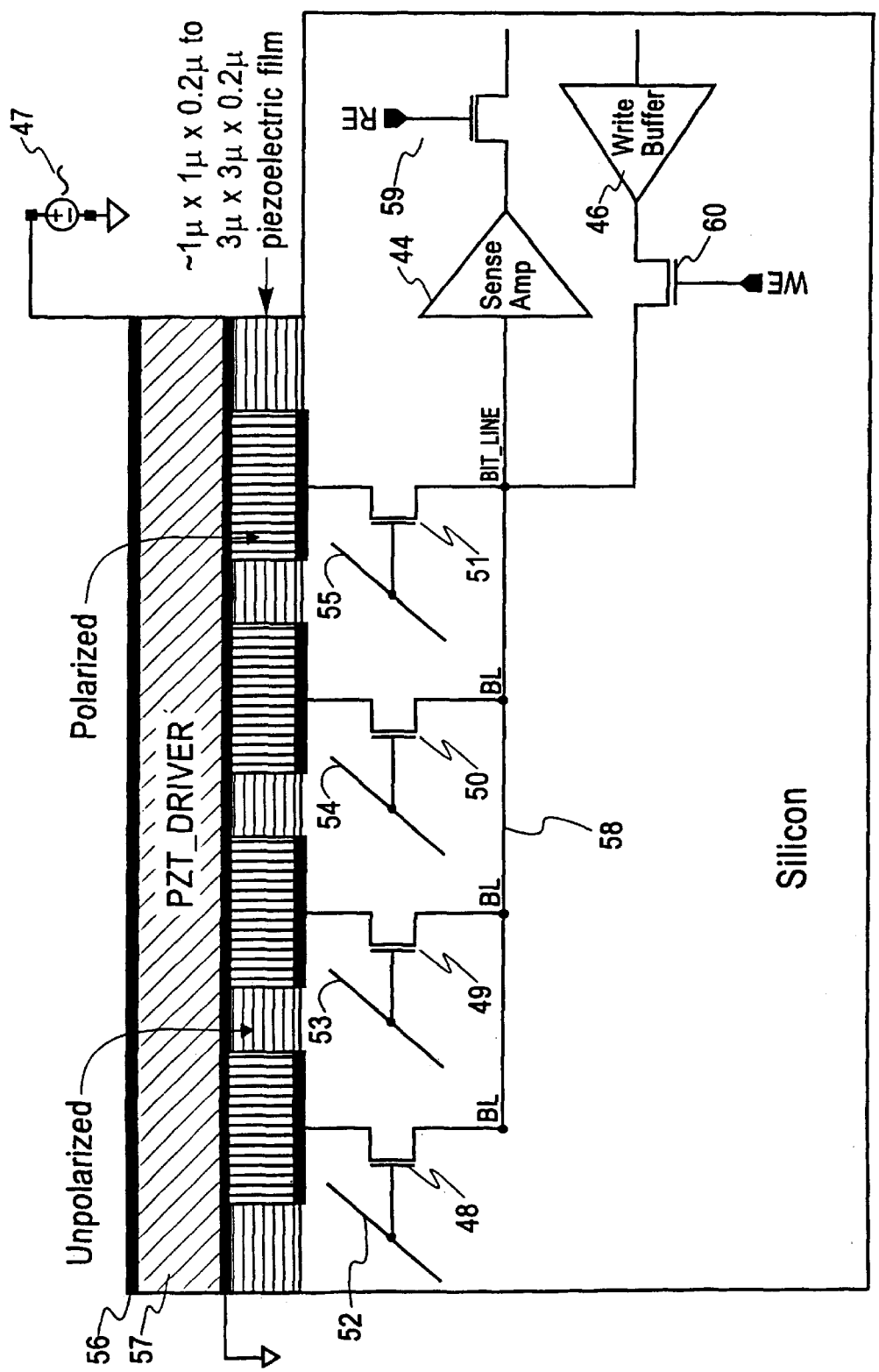
FIG. 4 shows a system comprising a plurality of adjacent ferroelectric cells, with a film on top of the plurality of cells that vibrates in response to an oscillating voltage applied across the second film.

FIG. 4 shows a plurality of storage cells, and circuitry for reading and writing the cells. The circuitry comprises a sense amplifier 44 for detecting the polarity of the voltage on the bit line, and a write buffer 46 for driving the bit line to a positive or negative voltage when the write enable (WE) signal is high. Each cell is coupled to the bit line through a respective passgate 48–51, and each passgate is controlled by a respective word line (WL) 52–55. Although an AC signal source is shown, it will be understood that either one of a pair of opposite-polarity DC voltage sources can be coupled to plate 56 by means of a switch actuated when a read is desired.

Thus, when a memory address is presented to the chip, decoding circuitry (not shown) operates on the address, and activates one of the word lines (WL). This connects one and only one of the cells of the structure of FIG. 4 to bit line 58. It will be understood that there can be many independent bit lines on the chip.

If the desired operation is a read, then the read enable (RE) signal is raised at the gate of passgate 59, and when the oscillating voltage on the metal plate 56 goes high, film 57 will expand and thereby induce a positive or negative voltage on the bit line in accordance with the polarization state of the selected cell. The sense amp 44 senses the polarity of the voltage on the bit line 58, and drives the appropriate signal through passgate 59, and in the case of a multi-row array, to a chip-level multiplexor (not shown) which selects appropriate bit-line outputs.

If the desired operation is a write, then the write enable (WE) signal is raised at the gate of passgate 60, and the bit line 58 is driven to a positive or negative voltage (giving a 1 or a 0 depending on the value of data to be stored) by the write buffer. This voltage sets the polarization state of the selected cell.

In the numerical example above, a load capacitance of 25 fF was assumed. Note that the actual capacitance depends on the number of cells connected to a single bit line as well as the capacitance of each cell. A wide range of designs is possible, and in general, a chip will contain many bit lines. For example, in a 1 square-inch chip, if there were 32 cells per bit line, there would be one million bit lines.

Note that the total data bandwidth off the chip is determined by the product of the frequency at which the resonating plate 56 is driven and the number of I/O pins that were driven off chip (purely a matter of design choice). Most ferroelectric films have resonant frequencies in the 20 MHz to 50 MHz range, and 1000 I/O pins is very reasonable in today's packaging technology. If the one million bit lines in the example above were multiplexed down to one thousand signal outputs, and if the structure were resonated at 20 MHz, the data rate from a single chip would be 2.5 GBytes per second.

Assuming 2.0 $\mu^2$/cell, a 1 square-inch chip contains 4 MBytes, and a data rate of 2.5 GBytes per second would read the entire contents of such a chip in 1.6 milliseconds. Therefore, a memory system may contain many such chips if run at this data rate. For example, 625 such chips could sustain this rate for one second.

Note that the latency associated with such a system is equal to the reciprocal of the resonant frequency. At 20 MHz, the latency is 50 microseconds. Further, this system offers random access capability. Thus, the system of the present invention provides distinct advantage over other nonvolatile media such as disks: higher bandwidth, lower latency, and random access capability.

The memory system of the present invention can be packaged with many chips together to achieve high volumetric density, as described below.

Figure 5:
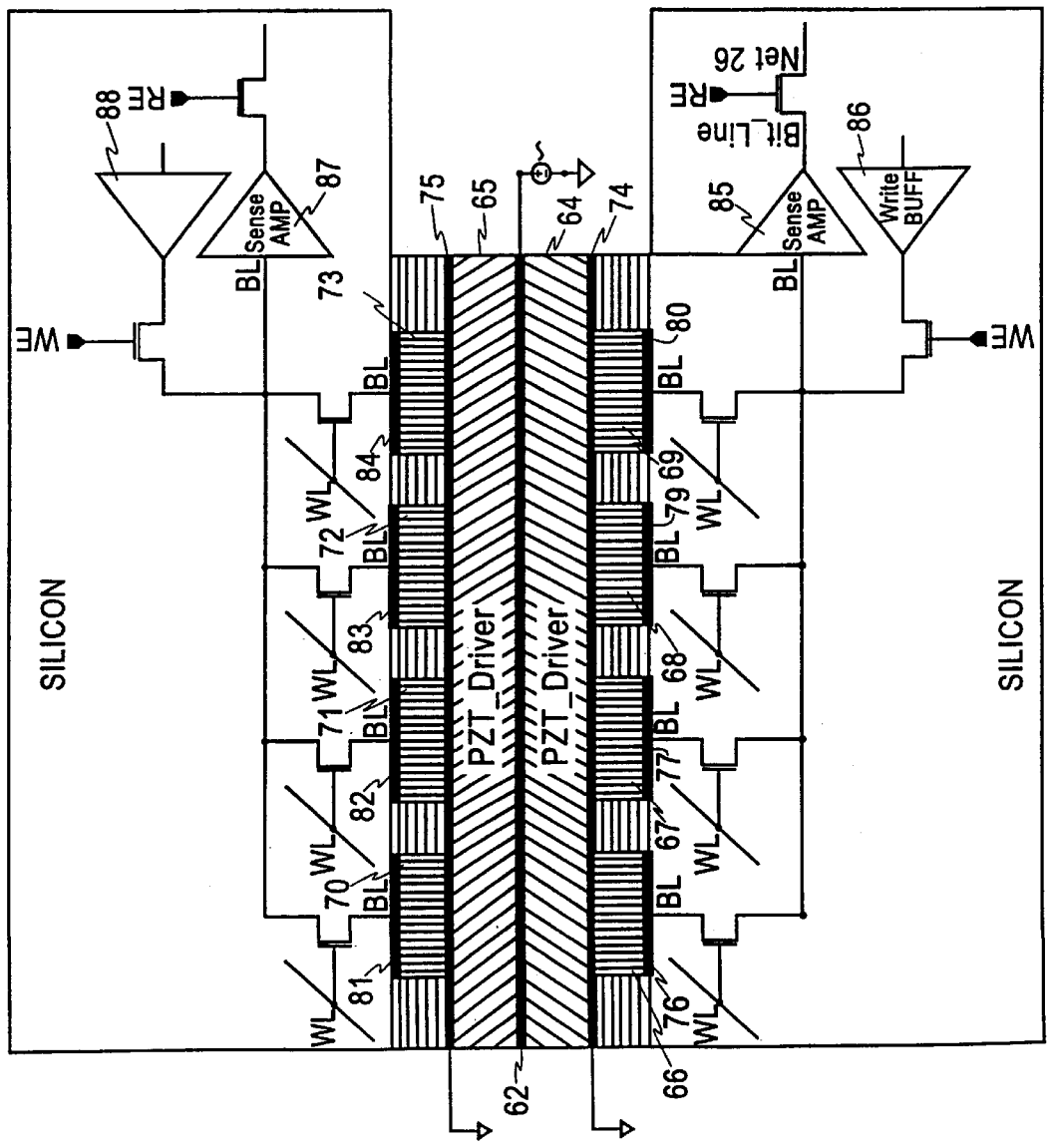
FIG. 5 shows two of the structures depicted in FIG. 4 coupled together face-to-face, one on top of the other, so that the pair of structures can share the voltage plate that induces mechanical vibration in each structure.

FIG. 5 shows a more complex memory arrangement in accordance with the invention. Specifically, two of the chips depicted in FIG. 4 can be combined into a single entity by placing the two chips together, face-to-face, so that a single resonating plate 62 is shared by the two chips. Each memory chip includes a ferroelectric film layer 64 and 65, respectively, and a plurality of memory cells comprising ferroelectric layers. 66–69 and 70–73. Layers 66–69 and 70–73 are separated from layers 64 and 65 by plates 74 and 75, respectively. Respective plates 76–84 provide second boundary for layers 66–73, respectively. Cells 66–69 can be read/written via sense amp 85 and write buffer 86 in the manner described with respect to FIG. 4. Cells 70–73 can be read/written via sense amp 87 and write buffer 88 in similar fashion. The capacity of this structure is double the capacity of a single chip.

Figure 6:
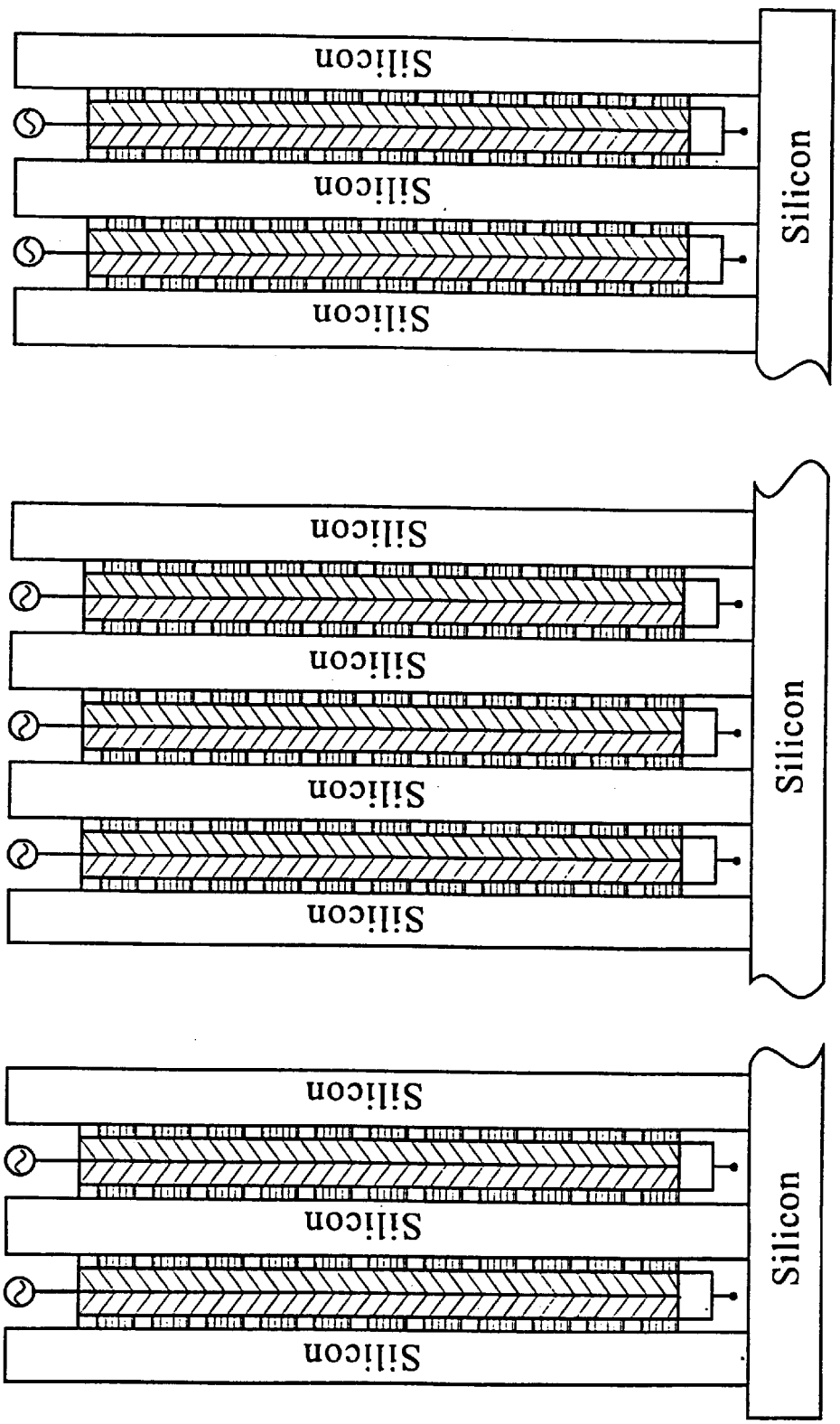
FIG. 6 shows a plurality of the structures depicted in FIG. 5 stacked up in a common stack to achieve high volumetric density.

FIG. 6 shows a plurality of the structures in FIG. 5 stacked together into a tower configuration. Note that the thickness of current chips typically is in the 100 micron to 300 micron range, and chips can be ground to still thinner dimensions (e.g., 10 microns) at higher cost if need be. Therefore, a single chip as shown in FIG. 4, with two layers of ferroelectric film, can easily and economically be made at a thickness of 125 microns with no special machining or processing steps. Note that a one-inch thick stack of such chips comprises 200 chips, corresponding to a volumetric density of 800 MBytes per cubic inch. Note that if multiple such structures were packed into a box and run in parallel, a single cubic foot box would hold over one Terabyte of nonvolatile storage, even with 30% of the volumetric capacity left over for fans (if needed) and power supplies. This means that a 3 foot by 4 foot by 8 foot rack could contain 100 Terabytes, and 10 such racks could hold a Petabyte. This is equivalent to having an entire large database available on nonvolatile storage with DRAM-like latency to all parts of the database.

Further, each rack could easily provide a bandwidth corresponding to hundreds of pages per cycle at a 20 MHz to 50 MHz rate, even with only a single I/O pin per chip, and it could provide those pages with a latency in the range of 50 nanoseconds. The data rate is practically limited by the number of wires that could be run out of the rack. Certainly, one page per cycle is very easy to do.

Figure 14:
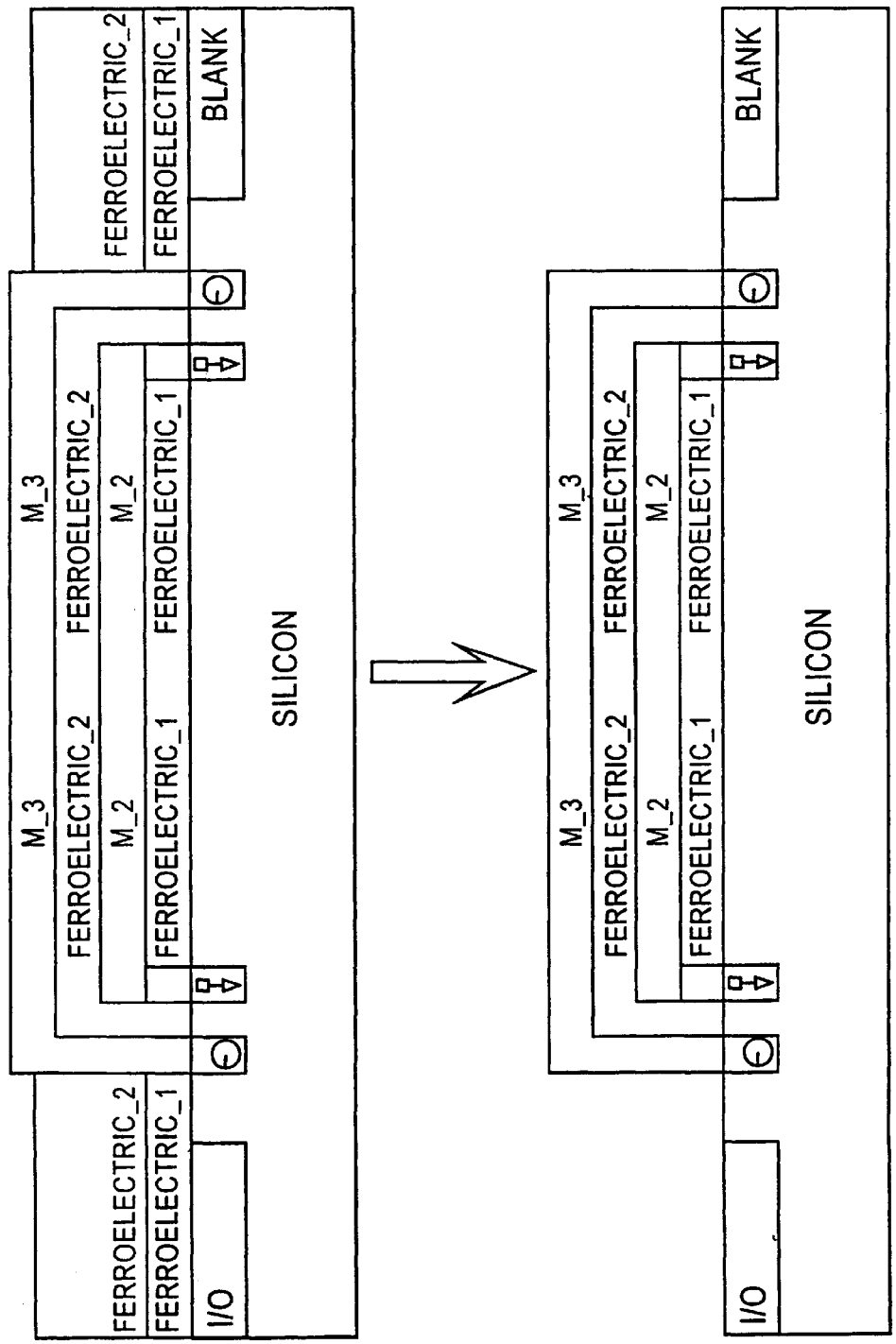
Figure 15:
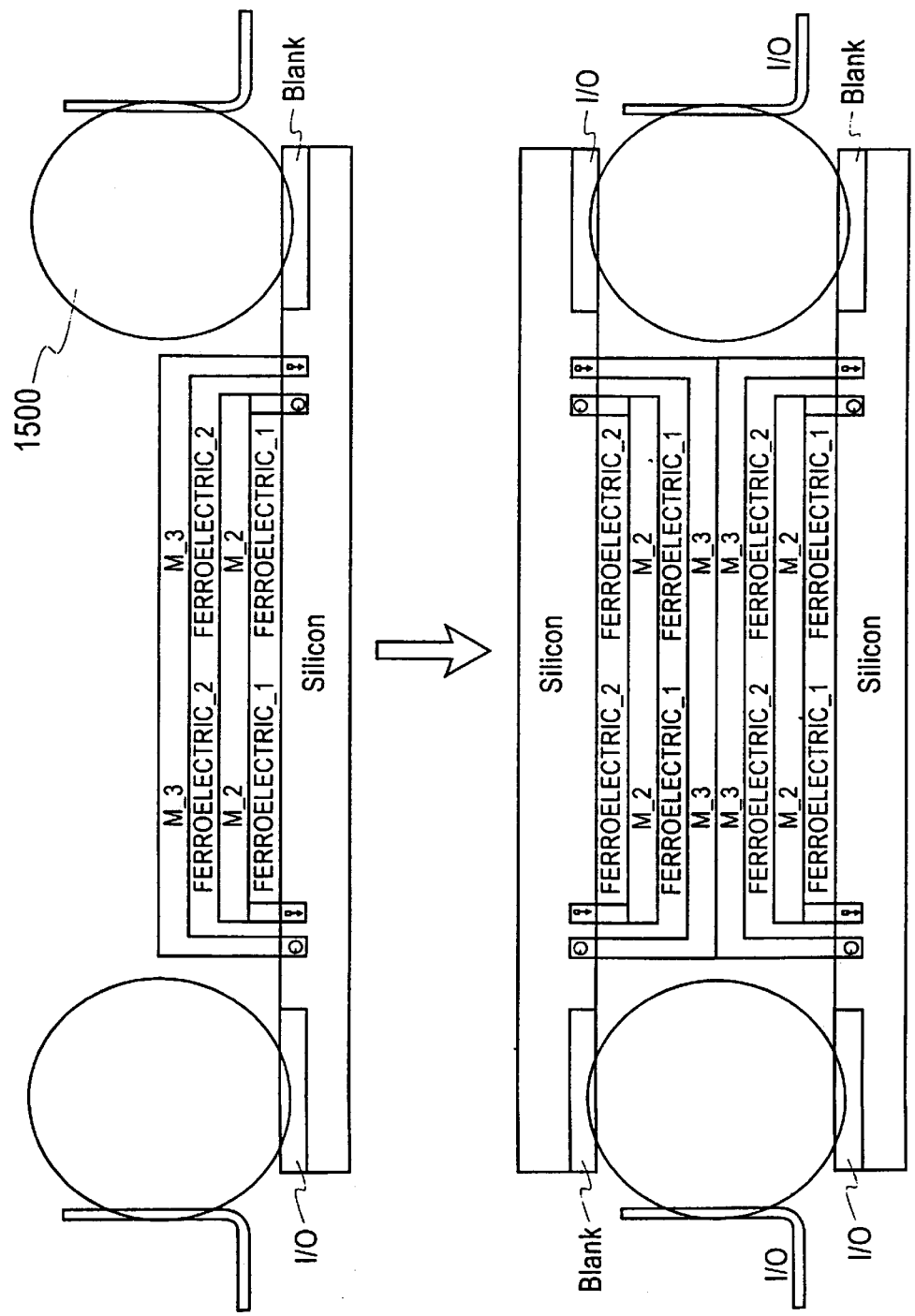

The processing steps associated with constructing a chip in accordance with the invention is now described with reference to FIGS. 7–15. FIGS. 7–13 are plan and side cross-sectional views of the chip in various stages of the process. FIGS. 14–15 are side cross-sectional views of further process stages.

Figure 7:
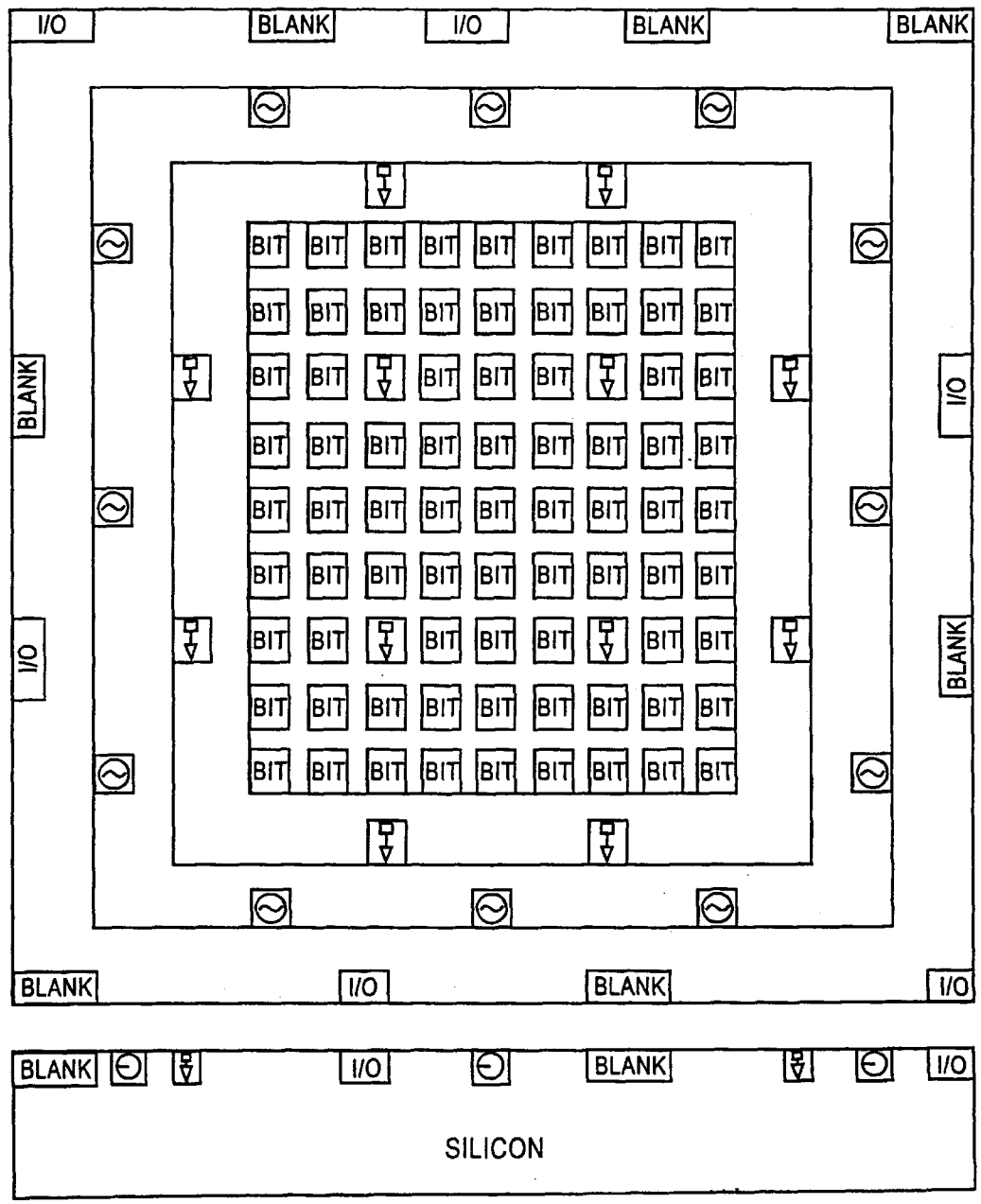
FIGS. 7–15 are sequential views of a process for constructing a chip in accordance with the invention.

The process begins following the construction of a memory chip, as shown in top and side cross-sectional views in FIG. 7. As shown, following the final processing step in the memory chip construction process, the surface of the chip is planarized SiO2 with properly placed and sized metal pads. Referring to the top view of FIG. 7, in an inner rectangular array, one pad serves for each bit (first metal plate). Ground pins are placed around the bit array, as indicated, and several ground pins can also be placed inside the bit array. The ground pins will be connected to the ground electrode of the first ferroelectric layer. AC pads, that will be connected to the second electrode of the first ferroelectric layer, are placed outside the ground pads, as shown.

I/O pads are placed along the perimeter of the chip. Next to each active I/O pad, there is a blank (floating) pad. These blank pads help to form flip-chip bonding between two chips and help to form wire bonds to the flip-chip-bonded devices. The composition of the metal pads (in many cases Pt/Ti alloy) is chosen to form proper electrode contact with the employed ferroelectric material and to be compatible with silicon technology.

Figure 8:
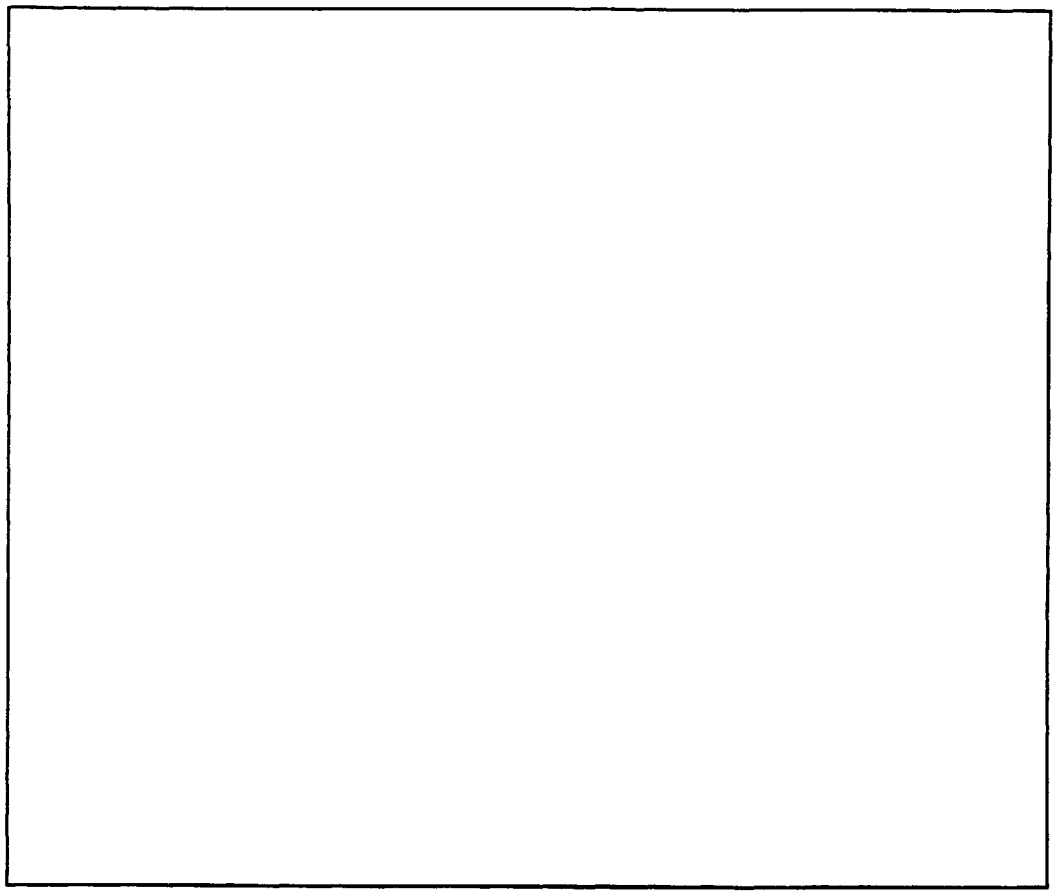
Figure 8:
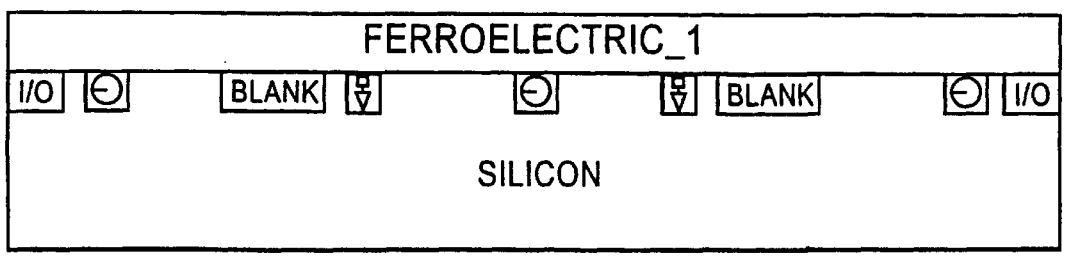

Referring now to FIG. 8, the next step of the process is to deposit a first ferroelectric layer of desired thickness on the planarized wafer surface, preferably by spin-coating. Other deposition techniques (Chemical or Physical Vapor Deposition etc.) may also be employed when certain deposition rate, deposition temperature, structure or type of ferroelectric film (like organic) is preferred. (See W. Wersing and R. Bruchhaus, SPIE Vol.2364, pp. 12, 1994). The thickness of the first ferroelectric layer is determined by the switching voltage intended to operate the device, and by the critical field (Ec), that is required for switching the polarization state of the employed ferroelectric material. In case of Ec=100 kV/cm and a switching voltage of 2.5 V, the thickness of the first ferroelectric film would be 0.000025 cm, i.e. 250 nm.

Figure 9:
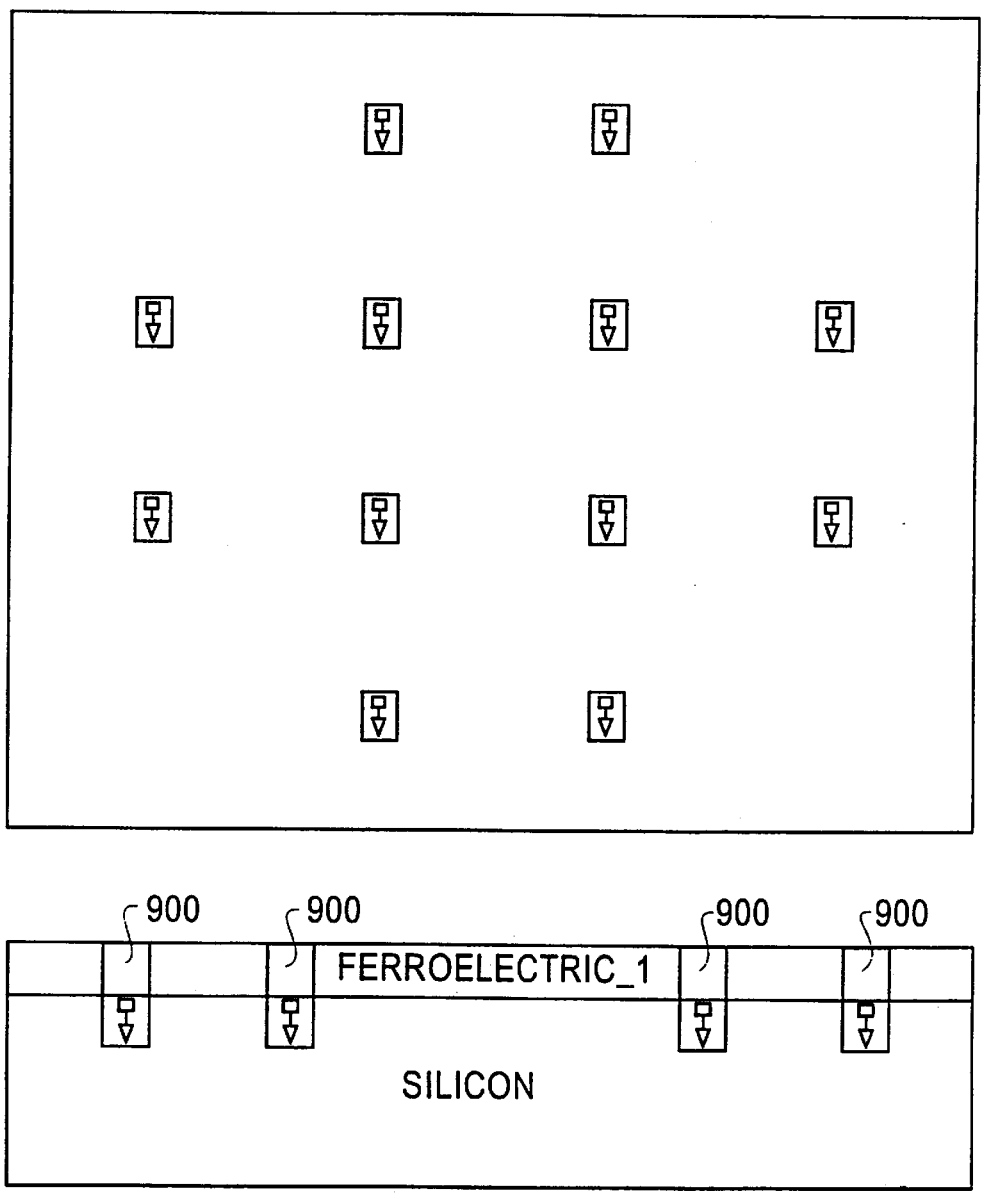

Referring now to FIG. 9, after deposition and initial annealing of the first ferroelectric layer, contact holes 900 are opened in a standard lithographic process over the position of the ground metal pads. The contact holes are preferably wet etched, using photomask, spun on the wafer.

Figure 10:
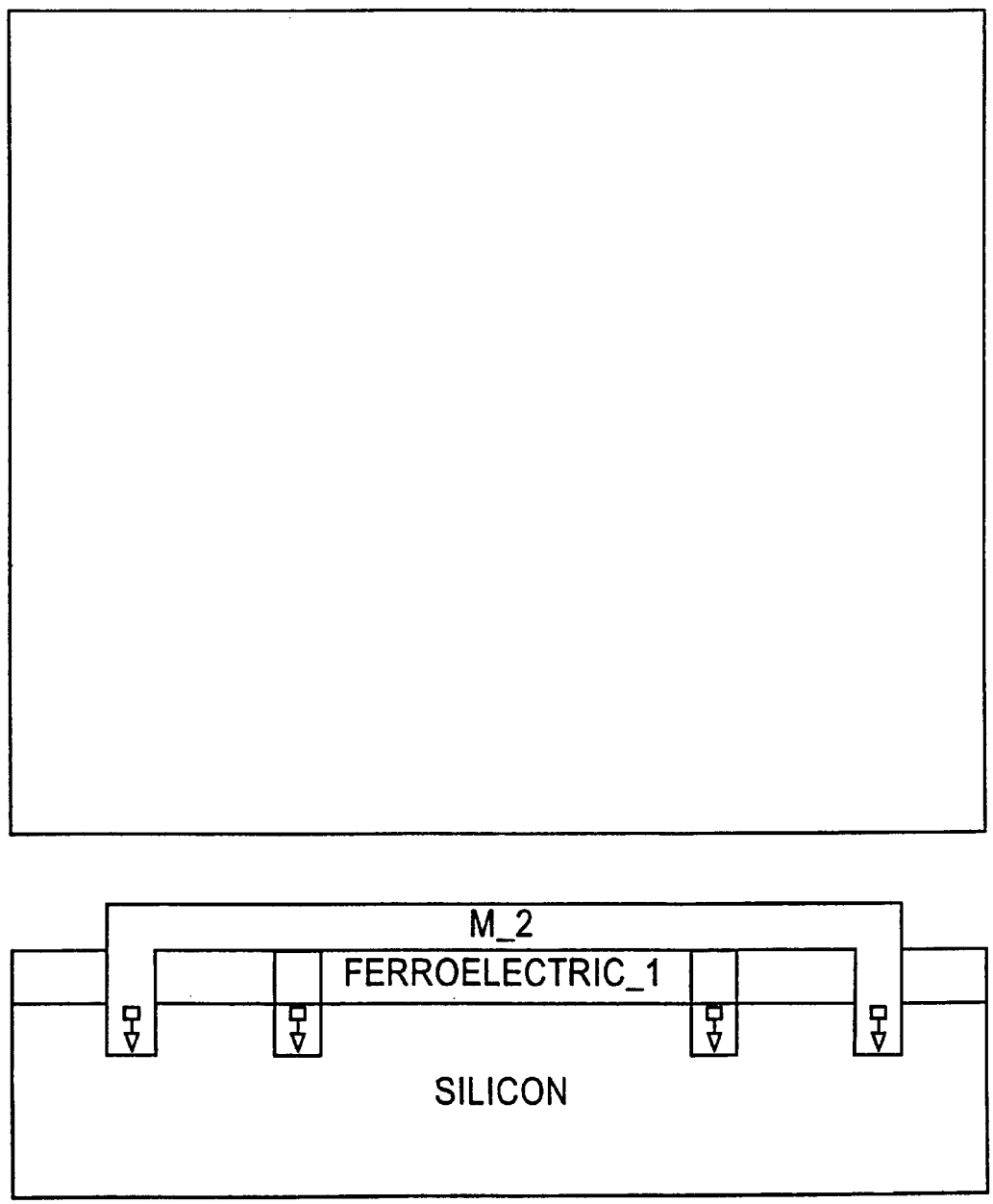

Referring to FIG. 10, a second metal electrode film (M_2) is now deposited on the first ferroelectric film in a rectangular shape, extending to the outer edge of the ground contact holes. In this process contact is made between the second metal layer on top of the first ferroelectric film and the first metal ground pads of the chip.

Figure 11:
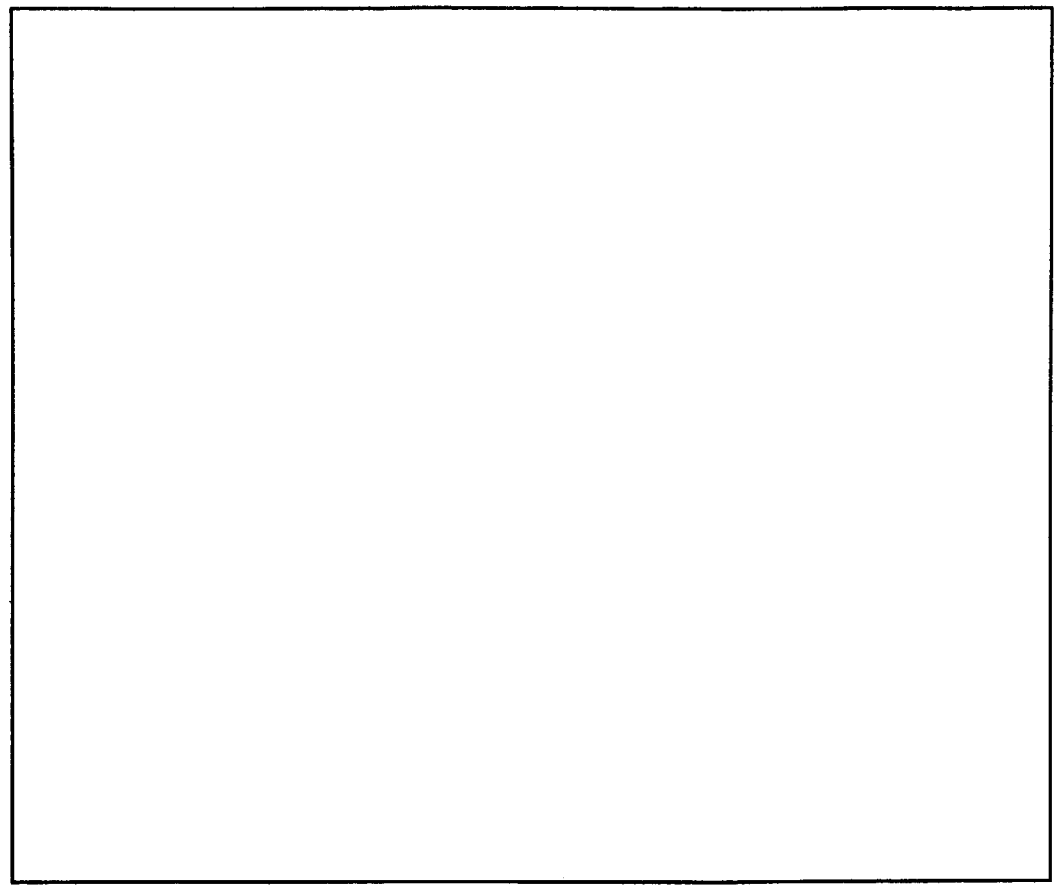
Figure 11:
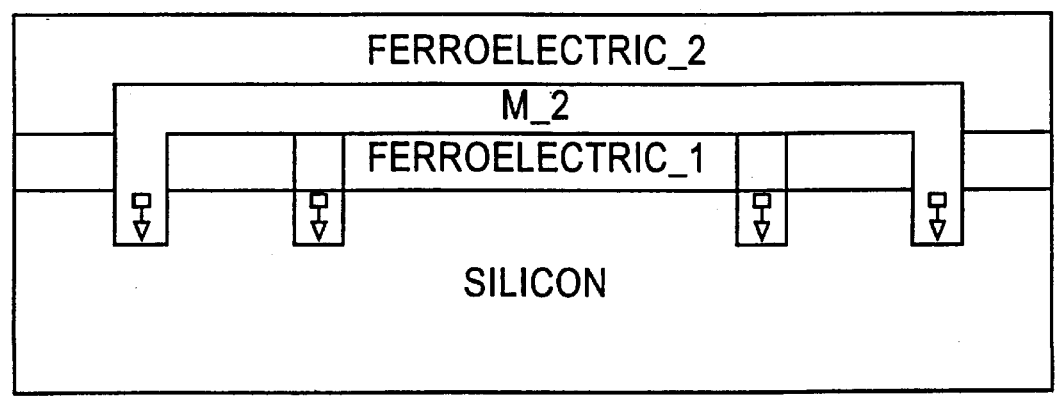

Referring to FIG. 11, a second layer of ferroelectric film is now deposited, covering the second metal layer (M2) and part of the first ferroelectric layer, that is extending beyond the M2-covered area. The thickness of the second ferroelectric film is tuned to provide proper and stable drive either at, or outside of resonance frequencies in a desired frequency range. The thickness of the second ferroelectric layer is expected to be several times that of the first ferroelectric layer. In that case the driving AC voltage (of the magnitude of the switching voltage) causes only small polarization modulation in the second ferroelectric film, which may result in more stable piezoelectric drive and lower power consumption. The deposition of the second ferroelectric layer is followed by a second thermal annealing step.

Figure 12:
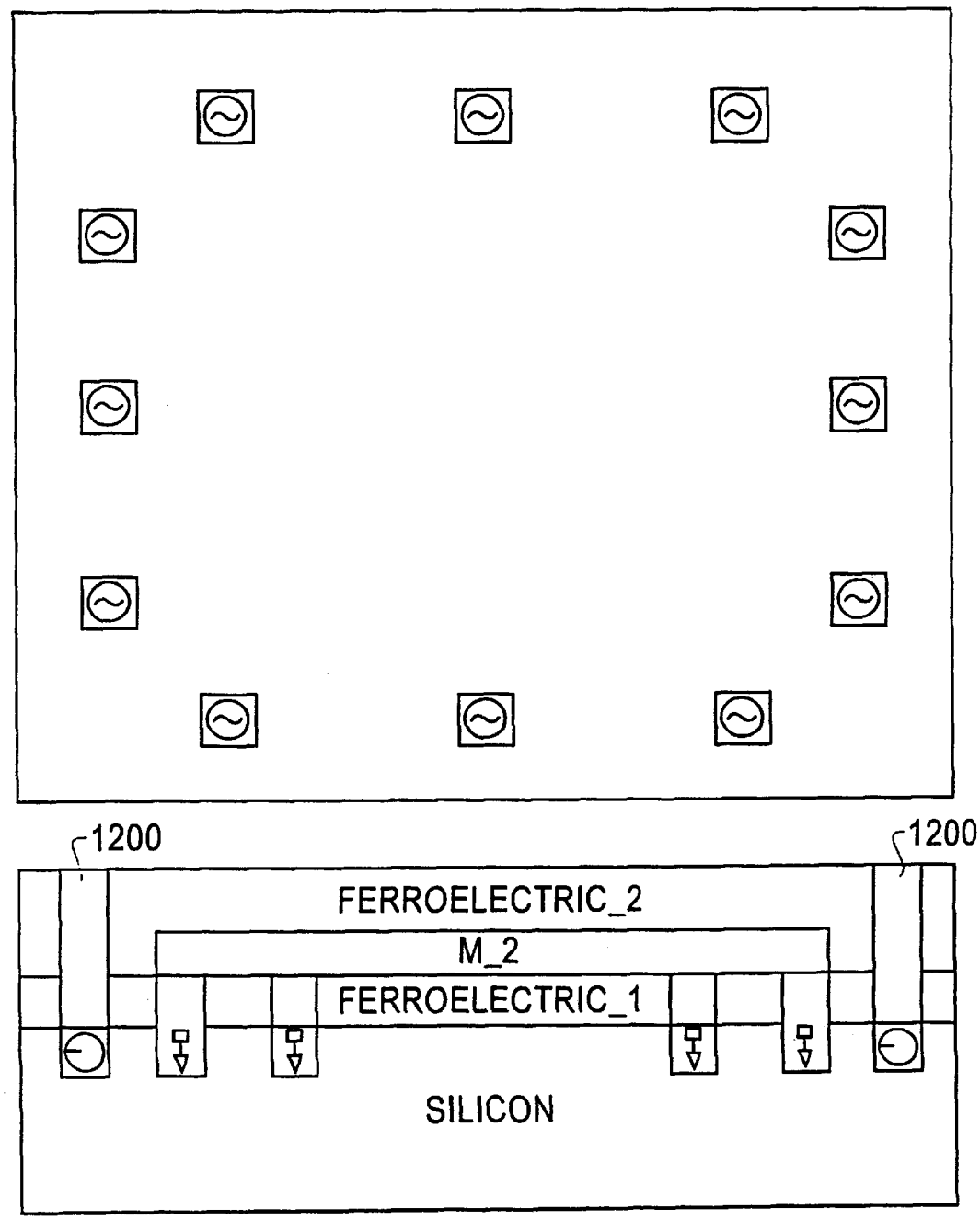

Referring to FIG. 12, contact holes 1200 are etched through the second and first ferroelectric layers at the corresponding AC pad locations. Through these vias, contact will be made between the AC pads and the second (driver) electrode of the second ferroelectric film.

Figure 13:
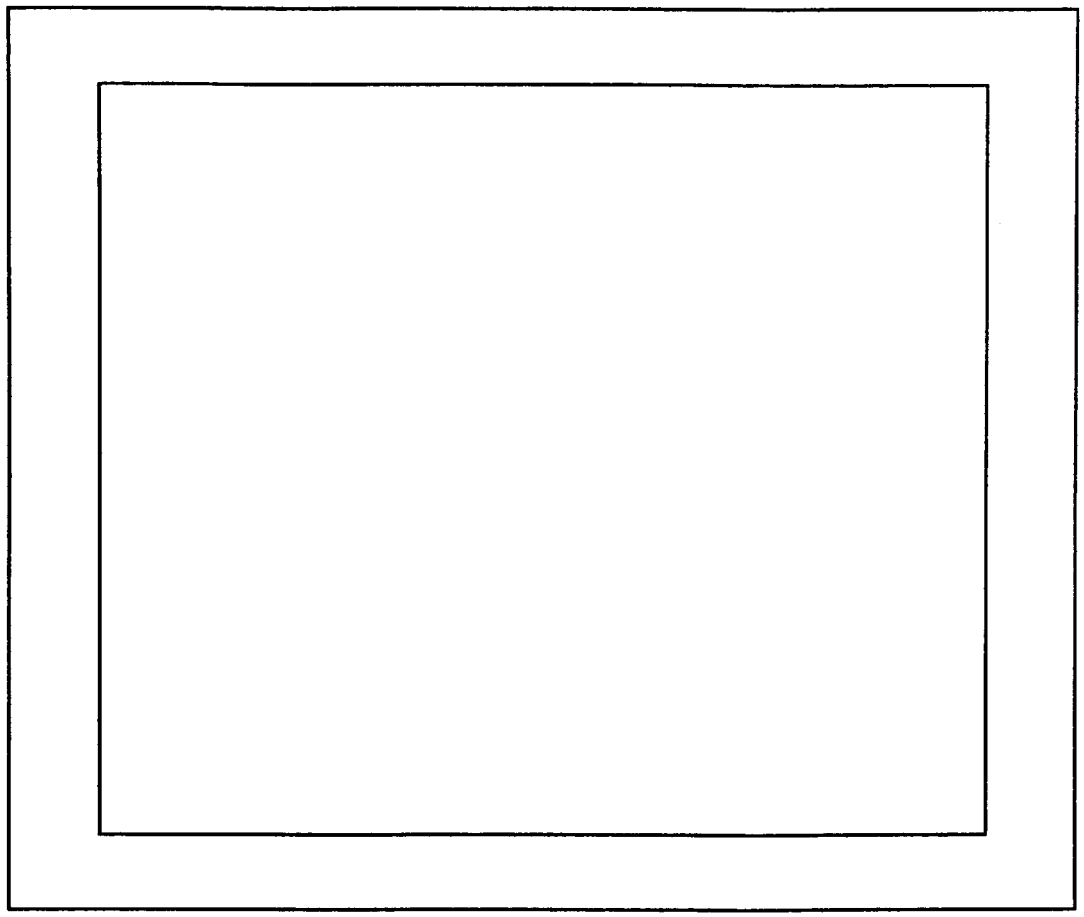
Figure 13:
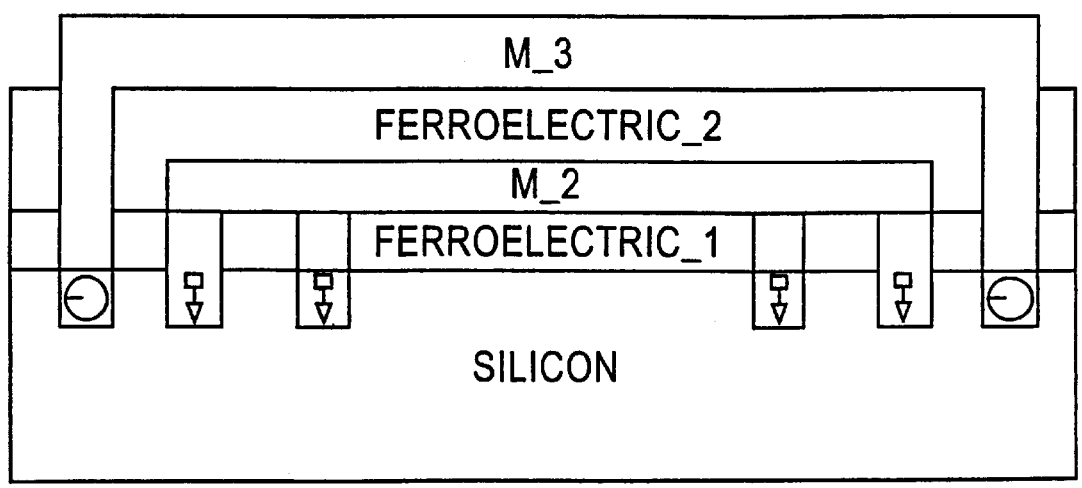

Referring to FIG. 13, a third layer of metal (M_3) is now deposited on top of the second ferroelectric film, covering an area extending to the outer edges of the AC pin vias. Through the previously prepared vias, contact is made between the M3 third metal layer and the first metal AC drive pads.

Referring to FIG. 14, in the next processing step the area of the first and second ferroelectric layers extending beyond the boundary of the third metal layer is etched away. After this step, the first metal I/O and blank pads on the original chip are accessible again.

Referring to FIG. 15, in the next processing step solder-balls 1500 are attached to the first metal I/O and blank pads (along with smaller size solder-balls or solder film on the third metal film), and flip-chip-bonding is performed. Note that when two chips face each other for bonding, each active I/O pad faces a blank one and vice versa. At proper temperature the two chips are pushed together until the M3 layers get in touch and the chips fuse together.

Note that the described special flip-chip bonding technique, with active I/O pads bonded to blank pads on the opposite chip offers not only increased strength, but also easy wire-bonding sites and possibility for side mounted chip stacking.

While the invention has been described in particular with respect to preferred embodiments thereof, it will be understood that modifications to those embodiments can be effected without departing from the spirit and scope of the invention.

Having thus described our invention, what we claim as new, and desire to secure by Letters Patent is:

1. A method for storing and reading data to and from a memory cell, comprising the steps of:

providing a memory cell comprising a first metal plate, a second plate, and a first ferroelectric film between the first and second metal plates;

applying a voltage across the first and second metal plates to set a desired polarity in the first ferroelectric film, the polarity indicating a stored data value;

applying a mechanical force to the first ferroelectric film to induce an electrical charge on one of the first and second metal plates, the induced electrical charge being indicative of the polarity of the first ferroelectric film; and sensing the induced electrical charge.

2. The method of claim 1, wherein the step of applying a voltage comprises the steps of:

maintaining the second metal plate at a ground potential; and applying one of a positive and negative voltage to the first metal plate.

3. The method of claim 1, wherein the step of applying a mechanical force to the memory cell comprises the steps of:

providing a second ferroelectric film on top of the second metal plate;

providing a third metal plate on top of the second ferroelectric film; and applying a positive voltage across the third and second metal plates to cause the second ferroelectric film to expand and induce one of a positive and negative voltage on the first metal plate in accordance with the polarity of the first ferroelectric film of the memory cell.

4. The method of claim 3, wherein the third metal plate is mechanically constrained to prevent movement of the third metal plate.

5. The method of claim 3, wherein the step of applying a positive voltage across the third and second metal plates comprises the step of applying an alternating current voltage signal to expand and contract the second ferroelectric film at its resonant frequency.

6. An apparatus for storing and reading data, comprising:

a memory cell comprising a first metal plate and a second metal plate and a first ferroelectric material between the first and second metal plates;

a circuit for writing data to the memory cell by applying an electric field across the first ferroelectric material to set a desired polarity in the first ferroelectric material, the polarity determining the value of the data;

means for applying a mechanical force to the first ferroelectric material to induce a buildup of charge on one of the first and second metal plates indicative of the polarization of the first ferroelectric material and therefore the value of the data.

7. The apparatus of claim 6, wherein the circuit for writing data to the memory cell comprises:

a passgate connected between the first metal plate and a bit line, the passgate being operated by a wordline; and a write buffer, connected to the bit line, for driving the bit line to a voltage corresponding to the data to be stored, wherein the voltage is applied to the first metal plate upon operation of the passgate.

8. The apparatus of claim 6, further comprising a sensing circuit for sensing the induced charge.

9. The apparatus of claim 8, wherein the sensing circuit comprises:

a passgate connected between the first metal plate and a bit line, the passgate being operated by a wordline; and a sense amplifier, connected to the bit line, for sensing a polarity of the voltage of the induced charge on the first metal plate upon operation of the passgate.

10. The apparatus of claim 6, wherein the means for applying a mechanical force to the first ferroelectric material comprises:

a second ferroelectric material on top of the second metal plate;

a third metal plate on top of the second ferroelectric material; and a voltage source, connected to the third metal plate, for applying a positive voltage across the third and second metal plates to cause the second ferroelectric material to expand and exert pressure on the first ferroelectric material so as to induce one of a positive and negative voltage on the first metal plate in accordance with the polarity of the first ferroelectric material of the memory cell.

11. The apparatus of claim 10, wherein the third metal plate is mechanically constrained to prevent movement of the third metal plate.

12. The apparatus of claim 10, wherein the voltage source is an alternating current voltage signal having a frequency that causes the second ferroelectric material to expand and contract at its resonant frequency.

* * * * *